United States Patent [19]

Machida et al.

[11] 4,240,834
[45] Dec. 23, 1980

[54] SYNTHETIC SINGLE CRYSTAL FOR ALEXANDRITE GEM

[75] Inventors: Hisashi Machida; Yoichiro Yoshihara, both of Otsu, Japan

[73] Assignee: Kyoto Ceramic Co., Ltd., Kyoto, Japan

[21] Appl. No.: 75,719

[22] Filed: Sep. 14, 1979

[51] Int. Cl.$^3$ .............................................. C04B 35/44
[52] U.S. Cl. ..................................... 106/42; 156/605
[58] Field of Search .................. 106/42; 423/595, 264, 423/265; 156/605, 617 SP

[56] References Cited

U.S. PATENT DOCUMENTS

| | | | |
|---|---|---|---|
| 1,952,255 | 3/1934 | Jaeger | 106/42 |
| 3,567,643 | 3/1971 | Flanigen et al. | 106/42 |
| 3,723,337 | 3/1973 | Yancey | 106/42 |
| 3,912,521 | 10/1975 | Cline et al. | 106/42 |

*Primary Examiner*—Helen M. McCarthy
*Attorney, Agent, or Firm*—Stuart Lubitz

[57] ABSTRACT

Disclosed is a synthetic single crystal for an alexandrite gem, which consists essentially of a synthetic chrysoberyl single crystal comprising aluminum oxide and beryllium oxide as the main components and chromium and vanadium as the coloring components, wherein vanadium is contained in an amount of about 0.00075 to about 2.95% by weight based on the crystal.

This single crystal shows a green or bluish green color under natural light and the color is changed to red or reddish violet when the single crystal is exposed to tungsten light the single crystal of the present invention is comparable or superior to natural alexandrite produced in the Ural Mountain Region with respect to the hue and color change characteristics.

5 Claims, No Drawings

SYNTHETIC SINGLE CRYSTAL FOR ALEXANDRITE GEM

BACKGROUND OF THE INVENTION (1) Field of the Invention:

The present invention relates to a synthetic crystal for an artificial gem. More particularly, the invention relates to a synthetic single crystal which simulates natural alexandrite in the hue and color change characteristics.

(2) Description of the Prior Art:

Research has heretofore been expended to artificially grow alexandrite having a crystal structure of chrysoberyl (BeO.Al$_2$O$_3$). A problem to be solved in commercially manufacturing an artificial gem of alexandrite is how to manufacture the gem such that the hue and color characteristics resembling those of natural alexandrite produced in the Ural Mountain Region, which is now regarded as having highest quality and value. More specifically, it is necessary to obtain a product which shows a green or bluish green color under natural light but shows a red or reddish violet color under the light of an electric lamp (tungsten light).

As means for solving this problem, the specification of U.S. Pat. No. 3,912,521 proposes a method in which chromium (Cr) and iron (Fe) are incorporated in aluminum oxide (Al$_2$O$_3$) and beryllium oxide (BeO) as the main components. Chromium is an additive element imparting color change characteristics to the resulting synthetic single crystal. However, a single crystal obtained by addition of chromium alone is much inferior to natural alexandrite produced in the Ural Mountain Region in the hue and color change characteristics, and the commercial value of this crystal as an artificial gem is very low. In the above-mentioned U.S. patent specification, therefore, iron is used as a second additive element in an attempt to obtain a desired hue by mingling the color of chromium with the color of iron.

This known single crystal for an artificial gem as taught in the above-mentioned patent is improved to some extent in the color change characteristics over a product formed by using chromium alone as an additive, but its color under natural light is slightly yellowish or brownish green, which is due to the presence of iron, and is therefore inferior to a green color possessed by natural alexandrite produced in the Ural Mountain Region. Furthermore, when this known single crystal is exposed to tungsten light and the color change is examined, it is seen that the color is changed to reddish violet, but the sensitivity to the color change or the degree of the color change is degraded because of influences of the above-mentioned yellowish or brownish hue. Accordingly, it cannot be said that this crystal is comparable to natural alexandrite produced in the Ural Mountain Region with respect to the color change characteristics. In short, a satisfactory synthetic single crystal for an alexandrite gem has heretofore not been developed.

SUMMARY OF THE INVENTION

Under the above-mentioned background, we have found that when chromium (Cr) and vanadium (V) are added as coloring components to aluminum oxide (Al$_2$O$_3$) and beryllium oxide (BeO) as the main components, the grown crystal can hardly be distinguished from natural alexandrite produced in the Ural Mountain Region with respect to the hue and color change characteristics. Based on this finding, we have now completed the present invention.

More specifically, in accordance with the present invention, there is provided a synthetic single crystal for an alexandrite gem, which consists essentially of a synthetic chrysoberyl single crystal comprising aluminum oxide and beryllium oxide as the main components and chromium and vanadium as the coloring components, wherein vanadium is contained in an amount of about 0.00075 to about 2.95% by weight based on the crystal.

DETAILED DESCRIPTION OF THE PREFERRED EMBODIMENTS

In the present invention, a known method may be utilized for the preparation of the intended single crystal. For example, there may be adopted a so-called flux melting method in which the starting substances are melted by using a flux, and a single crystal is grown on the seed while gradually cooling the melt in the supersaturated state. Alternatively, a direct melting method can be used in which a flux is not used at all. The direct melting method includes the Czochralski method (rotating pull-up method), the Verneuil method and the Bridgman method.

A natural chrylsoberyl crystal or a synthetic crystal cut in a predetermined orientation may be used as the seed.

The main starting substances of the synthetic single crystal for an alexandrite gem according to the present invention are aluminum oxide (Al$_2$O$_3$) and beryllium oxide (BeO), and the coloring components to be added to these main starting substances are chromium (Cr) and vanadium (V). As the starting chromium component, there are preferably employed chromium oxides such as chromium (III) oxide (Cr$_2$O$_3$) and chromium (IV) oxide (CrO$_2$), and as the starting vanadium component, there are preferably employed vanadium oxides such as vanadium (V) oxide (V$_2$O$_5$), vanadium (III) oxide (V$_2$O$_3$) and vanadium (IV) oxide (VO$_2$).

As a result of experiments made on the chromium and vanadium contents in the grown synthetic single crystal, it was found that the hue and color change characteristics of the synthetic single crystal are influenced particularly sensitively by the vanadium content.

In the present invention, in order to reproduce a beautiful hue and unique color change characteristics inherent of natural alexandrite produced in the Ural Mountain Region in the synthetic single crystal, it is important that vanadium should be present in the single crystal in an amount of about 0.00075 to about 2.95% by weight, preferably about 0.0009 to about 2.498% by weight. When the content of vanadium (V) is lower than 0.0007% by weight, the color under natural light is not green, but becomes reddish, and no color change takes place even if the single crystal is exposed to tungsten light. When the vanadium content is 3% by weight or higher, the color under natural light is densely bluish green and no color change is caused at all when the single crystal is exposed to tungsten light. Therefore, in each case, a product having a commercial value cannot be obtained. Accordingly, in order to obtain the desired hue and color change characteristics, the vanadium content should be appropriately controlled within the above-mentioned range.

The chromium (Cr) content suitable for the vanadium content in the above-mentioned appropriate range is about 0.00006 to about 3.45% by weight, preferably about 0.0005 to about 3.12% by weight. However, even if the chromium content is deviated from this range to some extent, the commercial value of the single crystal as an artificial gem is not drastically reduced. If the chromium content exceeds 6% by weight, the single crystal does not show a green color under natural light, but it becomes reddish. If the chromium content is lower than 0.00006% by weight, no color change takes place when the single crystal is exposed to tungsten light. In each case, the commerical value of the single crystal as an artificial alexandrite gem is reduced.

An appropriate mixing ratio of the aluminum oxide and beryllium oxide as the main starting substances and the chromium oxide and vanadium oxide as the coloring substances, which is required for maintaining the chromium and vanadium contents within the above-mentioned appropriate ranges in the resulting synthetic single crystal, can easily be determined based on experiments. For example, the amount of the main starting substances and coloring substances are arranged so that in the melt of the main starting substances and coloring substances, chromium is present in an amount of about 0.00007 to about 3.5% by weight, preferably about 0.00006 to about 3.20% by weight, and vanadium is present in an amount of about 0.0008 to about 3.0% by weight, preferably about 0.001 to about 2.5% by weight.

When about 0.00006 to 3.45% by weight of chromium and about 0.00075 to about 2.95% by weight of vanadium are incorporated as the coloring components in a chrysoberyl single crystal according to the present invention, the single crystal shows a beautiful green or bluish green color under natural light and when it is exposed to tungsten light, the color is sensitively and violently changed to red or reddish violet. In short, there can be obtained an artificial alexandrite gem which simulates natural alexandrite produced in the Ural Mountain Region and has a very high commercial value. Especially when the chromium content in the synthetic single crystal is about 0.0005 to about 3.12% by weight and the vanadium content in the synthetic single crystal is about 0.0009 to about 2.498% by weight, the resulting synthetic single crystal has the hue and color change characteristics comparable or superior to those of natural alexandrite produced in the Ural Mountain Region, and it can hardly be distinguished from natural alexandrite produced in this Region.

Prominent advantages attained by the present invention will become apparent from the following Examples and Comparative Examples that by no means limit the scope of the invention.

EXAMPLE 1

| Component | Content (% by weight) |
| --- | --- |
| Aluminum oxide ($Al_2O_3$) | 79.50 |
| Beryllium oxide (BeO) | 19.65 |
| Chromium (III) oxide ($Cr_2O_3$) | 0.60 |
| Vanadium (V) oxide ($V_2O_5$) | 0.25 |

The above composition was charged in a crucible having a diameter of 50 mm, and the crucible was placed in an induction melting apparatus. The crucible was heated to about 1900° C. while diffusing an inert gas in a quartz tube and this temperature was maintained for 1 hour. Then, a natural chrysoberyl seed crystal was thrown into the melt to initiate growth of the crystal. The seed crystal was rotated at 70 r.p.m. to grow the crystal so that the diameter became 25 mm, and the crystal was pulled up at a rate of 25 mm/hr until a single crystal having a length of 150 mm was obtained. The so obtained single crystal was characterized by a specific gravity of 3.72, a refractive index of 1.743° to 1.752° and a birefringence of +0.009. From results of analysis according to the atomic-absorption spectroscopy, it was found that the single crystal contained 0.401% by weight of chromium and 0.138% by weight of vanadium. This single crystal showed a green color under natural light, and when the single crystal was exposed to tungsten light, the color was sensitively and violently changed to reddish violet. It was found that this single crystal was comparable or superior to natural alexandrite produced in the Ural Mountain Region with respect to the hue and color change characteristics.

EXAMPLE 2

| Component | Content (% by weight) |
| --- | --- |
| Aluminum oxide ($Al_2O_3$) | 77.16 |
| Beryllium oxide (BeO) | 18.01 |
| Chromium (III) oxide ($Cr_2O_3$) | 0.60 |
| Vanadium (IV) oxide ($VO_2$) | 4.23 |

In the same manner as described in Example 1, a single crystal was grown from a melt having the above composition. The obtained single crystal was characterized by the specific gravity, refractive index and birefringence similar to those of the single crystal obtained in Example 1. From results of analysis according to the atomic-absorption spectroscopy, it was found that the single crystal contained 0.401% by weight of chromium and 2.589% by weight of vanadium. This single crystal showed a green color under natural light but the color was changed to reddish violet when the single crystal was exposed to tungsten light, though the density was slightly lower than the reddish violet color of the sample obtained in Example 1. However, this single crystal was still comparable to natural alexandrite produced in the Ural Mountain Region and was found to have a sufficiently high commercial value.

EXAMPLE 3

| Component | Content (% by weight) |
| --- | --- |
| Aluminum oxide ($Al_2O_3$) | 79.70 |
| Beryllium oxide (BeO) | 19.45 |
| Chromium (III) oxide ($Cr_2O_3$) | 0.8488 |
| Vanadium (III) oxide ($V_2O_3$) | 0.0012 |

In the same manner as described in Example 1, a single crystal was grown from a melt having the above composition. The obtained single crystal was characterized by the specific gravity, refractive index and birefringence similar to those of the single crystal obtained in Example 1. From results of analysis according to the atomic-absorption spectroscopy, it was found that the single crystal contained 0.58% by weight of chromium and 0.0008% by weight of vanadium. The density of the green color of this single crystal under natural light was relatively low, but the color change under tungsten light was prominent, and it was found that the single crystal obtained in this Example as well as the single crystal obtained in Example 2 was also comparable to natural alexandrite produced in the Ural Mountain Region.

EXAMPLE 4

A mixture of 4.5% by weight of the same composition as used in Example 1 and 95.5% by weight of lithium molybdate ($Li_2MoO_4$) as a flux was heated at about 1300° C. to form a melt, and while the melt was gradually cooled with a low temperature gradient, a natural chrysoberyl seed crystal was placed in the melt to grow a single crystal on this seed crystal. The specific gravity, refractive index and birefringence of the resulting single crystal were similar to those of the single crystal obtained in Example 1. From results of the atomic-absorption spectroscopy, it was found that the single crystal contained 0.395% by weight of chromium and 0.128% by weight of vanadium. Results of observation of the hue and color change of this single crystal were substantially the same as those obtained in Example 1.

EXAMPLE 5

| Component | Content (% by weight) |
| --- | --- |
| Aluminum oxide ($Al_2O_3$) | 79.900 |
| Beryllium oxide (BeO) | 19.496 |
| Chromium (III) oxide ($Cr_2O_3$) | 0.0021 |
| Vanadium (V) oxide ($V_2O_5$) | 0.6019 |

In the same manner as described in Example 1, a single crystal was grown from a melt having the above composition. The specific gravity, refractive index and birefringence of the so obtained single crystal were similar to those of the single crystal obtained in Example 1. From results of analysis according to the atomic-absorption spectroscopy, it was found that the single crystal contained 0.0012% by weight of chromium and 0.3288% by weight of vanadium. It was confirmed that this single crystal was comparable to natural alexandrite produced in the Ural Mountain Region with respect to the hue and color change characteristics.

EXAMPLE 6

| Component | Content (% by weight) |
| --- | --- |
| Aluminum oxide ($Al_2O_3$) | 76.50 |
| Beryllium oxide (BeO) | 17.97 |
| Chromium (III) oxide ($Cr_2O_3$) | 4.62 |
| Vanadium (V) oxide ($V_2O_5$) | 0.91 |

In the same manner as described in Example 1, a single crystal was grown from a melt having the above composition. The specific gravity, refractive index and birefringence of the so obtained single crystal were similar to those of the single crystal obtained in Example 1. From results of analysis according to the atomic-absorption spectroscopy, it was found that the single crystal contained 2.98% by weight of chromium and 0.41% by weight of vanadium. It was confirmed that this single crystal as well as the single crystal obtained in Example 5 was comparable to natural alexandrite produced in the Ural Mountain Region with respect to the hue and color change characteristics.

COMPARATIVE EXAMPLE 1

| Component | Content (% by weight) |
| --- | --- |
| Aluminum oxide ($Al_2O_3$) | 74.67 |
| Beryllium oxide (BeO) | 18.40 |
| Chromium (III) oxide ($Cr_2O_3$) | 0.93 |
| Vanadium (V) oxide ($V_2O_5$) | 6.0 |

In the same manner as described in Example 1, a single crystal was grown from a melt having the above composition. From results of analysis according to the atomic-absorption spectroscopy, it was found that this single crystal contained 0.62% by weight of chromium and 3.21% by weight of vanadium. This single crystal showed a dense bluish green color under natural light, and when the single crystal was exposed to tungsten light, the single crystal showed the same dense bluish green color and no color change was observed.

COMPARATIVE EXAMPLE 2

| Component | Content (% by weight) |
| --- | --- |
| Aluminum oxide ($Al_2O_3$) | 77.020 |
| Beryllium oxide (BeO) | 18.108 |
| Chromium (III) oxide ($Cr_2O_3$) | 4.8714 |
| Vanadium (V) oxide ($V_2O_5$) | 0.0006 |

In the same manner as described in Example 1, a single crystal was grown from a melt having the above composition. From results of the atomic-absorption spectroscopy, it was found that this single crystal contained 3.28% by weight of chromium and 0.00028% by weight of vanadium. This single crystal showed a red color under natural light, but it similarly showed a red color under tungsten light and no color change was observed.

As will be apparent from comparison of the results obtained in the Examples according to the present invention with the results obtained in the Comparative Examples, by incorporating a specific amount of vanadium in a synthetic single crystal for an artificial alexandrite gem according to the present invention, there can be obtained a synthetic single crystal which is comparable or superior to natural alexandrite produced in the Ural Mountain Region, with respect to the hue and color change characteristics. Thus, an artificial alexandrite gem having a very high commercial value is produced according to the present invention.

The synthetic single crystal for an artificial alexandrite gem according to the present invention is not limited to those specifically disclosed in the foregoing Examples. As will be apparent to those skilled in the art, various changes, modifications and additions may be made without departing from the scope set forth in the claims.

What we claim is:

1. A synthetic chrysoberyl single crystal for an alexandrite gem, which consists essentially of aluminum oxide and beryllium oxide as the main components, and chromium and vanadium as the coloring components which produce the hue and color change characteristic of an alexandrite gem, wherein the chromium is present in an amount of about 0.00006 to 3.45% by weight based on the weight of the crystal, and the vanadium is present in an amount of about 0.00075 to about 2.95% by weight based on the crystal.

2. A synthetic single crystal as set forth in claim 1 wherein the vanadium is present in an amount of about 0.0009 to about 2.498% by weight based on the crystal.

3. A synthetic single crystal as set forth in claim 1 or 3 wherein chromium is present in an amount of about 0.0005 to about 3.12% by weight based on the crystal.

4. A synthetic single crystal as set forth in claim 1 wherein the source of chromium as the coloring component is at least one member selected from the group consisting of chromium (III) oxide and chromium (IV) oxide.

5. A synthetic single crystal as set forth in claim 1 wherein the source of vanadium as the coloring component is at least one member selected from the group consisting of vanadium (V) oxide, vanadium (III) oxide and vanadium (IV) oxide.

* * * * *